(12) United States Patent
Chang et al.

(10) Patent No.: US 7,724,174 B2
(45) Date of Patent: May 25, 2010

(54) SUCCESSIVE APPROXIMATION ADC WITH BINARY ERROR TOLERANCE MECHANISM

(75) Inventors: Soon-Jyh Chang, Tainan (TW);
Chun-Cheng Liu, Tainan (TW);
Chih-Haur Huang, Tainan (TW)

(73) Assignees: Himas Media Solutions, Inc., Tainan County (TW); NCKU Research and Development Foundation, Tainan (TW)

( * ) Notice: Subject to any disclaimer, the term of this patent is extended or adjusted under 35 U.S.C. 154(b) by 35 days.

(21) Appl. No.: 12/247,199

(22) Filed: Oct. 7, 2008

(65) Prior Publication Data

US 2010/0085225 A1 Apr. 8, 2010

(51) Int. Cl.
*H03M 1/34* (2006.01)
(52) U.S. Cl. ........................................ 341/163; 341/155
(58) Field of Classification Search .......... 341/120–165
See application file for complete search history.

(56) References Cited

U.S. PATENT DOCUMENTS

| | | | | |
|---|---|---|---|---|
| 5,175,547 | A * | 12/1992 | Lyon et al. | 341/120 |
| 5,185,607 | A * | 2/1993 | Lyon et al. | 341/120 |
| 6,707,403 | B1 * | 3/2004 | Hurrell | 341/155 |
| 6,828,927 | B1 * | 12/2004 | Hurrell et al. | 341/156 |
| 7,038,609 | B1 * | 5/2006 | Hurrell | 341/156 |
| 7,342,530 | B2 * | 3/2008 | Kuttner | 341/163 |

* cited by examiner

*Primary Examiner*—Lam T Mai
(74) *Attorney, Agent, or Firm*—Stout, Uxa, Buyan & Mullins, LLP

(57) ABSTRACT

A successive approximation ADC is disclosed. A comparator receives and compares a sampled input signal and an output of a DAC. Non-binary successive approximation register (SAR) control logic controls sampling of the input signal and controls a sequence of comparisons based on comparison result of the comparator. The SAR control logic controls each comparison when signal or charge in the DAC has not been completely settled. A binary-error-tolerant corrector is then used to compensate the sampling error.

12 Claims, 4 Drawing Sheets

C7=2C6=4C5=8C4=16C3=32C2=64C1=64C0

C7=2C6=4C5=4C5c=8C4=16C3=16C3c=32C2=64C1=64C1c

```
        1  1  1  0  1  0  1  1
       B1 B2 B3 B5 B6 B8 B9 B11
    +        B4    B7    B10
    ─────────────────────────────
ADC    ①  ②  ③  ④  ⑤  ⑥  ⑦  ⑧
Output
Bits
```

FIG. 4

```
        1  1  1  0  1  0  1  1
        1  0  0  0  1  1  1  0
    +         0     1     1
    ─────────────────────────────
ADC     1  0  0  0  0  0  1  1
Output
Bits
```

FIG. 5

HA: half adder
FA: full adder

SUCCESSIVE APPROXIMATION ADC WITH BINARY ERROR TOLERANCE MECHANISM

BACKGROUND OF THE INVENTION

1. Field of the Invention

The present invention generally relates to analog-to-digital converters (ADCs), and more particularly to a successive approximation register (SAR) ADC with binary error tolerance.

2. Description of the Prior Art

Flash analog-to-digital converter (ADC), pipelined ADC, and successive approximation register (SAR) ADC schemes embody widely used ADC architectures that have respective advantages in specific applications. The SAR ADC requires less power consumption and silicon area (and thus cost) as compared to other ADC architectures. Nevertheless, the SAR ADC needs more cycles to obtain the digital output, and therefore is not a good fit for high speed applications.

The SAR DAC is subdivided into two methods: binary approximation and non-binary approximation. The binary approximation ADC was disclosed, for example, in "A 65-fJ/Conversion-step 0.9-V 200-KS/s Rail-to-Rail 8-bit Successive Approximation ADC," IEEE J. Solid-State Circuits, vol. 42, October 2007, pp. 2161-2168, by Hao-Chiao Hong and Guo-Ming Lee, the disclosure of which is hereby incorporated by reference. In this disclosure, a digital-to-analog (DAC) is used to successively approximate a sampled signal, which is then compared by a comparator to determine whether setting or resetting next bit. This binary search continues several times with each voltage difference inversely proportional to $2^n$, until the equivalent digital output is obtained. The binary approximation was also disclosed, for example, in "A 65fJ/Conversion-Step 0-to-50MS/s 0-to-0.7 mW 9b Charge-sharing SAR ADC in 90 nm Digital CMOS," ISSCC Dig. Tech. Papers, February 2007, pp. 246-247, by J. Craninckx and G. van der Plas, the disclosure of which is hereby incorporated by reference. This disclosure applies the same operation principle as that discussed above, but uses a comparator to compare the charge difference in order to determine whether adding or subtracting further charge. This binary search continues several times with each charge difference inversely proportional to $2^n$, until the equivalent digital output is obtained. In the operation, the speed of the ADC of this binary approximation method is limited, because the comparator in either disclosure should wait for complete settling time until the voltage or charge is within the accuracy of ½LSB (that is, $\frac{1}{2}^{N+1}$, where N is the resolution of the ADC), otherwise, sampling error incurs.

The non-binary method was disclosed, for example, in "A 1.2-V 10-b 20-Msample/s nonbinary successive approximation ADC in 0.13-m CMOS," IEEE Int. Solid-State Circuits Conf. Dig. Tech. Papers, 2002, pp. 176-177, by F. Kuttner, the disclosure of which is hereby incorporated by reference. Contrary to the binary approximation, the voltage difference in the non-binary approximation method in not inversely proportional to $2^n$, but $1.85^n$. Owing to the capability of tolerating sampling error up to about 12.7%, this non-binary approximation method can sample an unstable signal, thereby reducing cycle time and data conversion time, however, at the cost of requiring additional and complex digital correction (e.g., logic circuit or read only memory (ROM)), and associated power consumption and silicon area.

For the reason that conventional approximation ADC architectures have respective disadvantages, a need has arisen to propose a novel ADC architecture that can maintain the advantages while avoid the disadvantages of conventional ADC architectures.

SUMMARY OF THE INVENTION

In view of the foregoing, it is an object of the present invention to provide a novel successive approximation ADC using an error-tolerant and high-speed non-binary approximation method with a binary error correction scheme.

According to one embodiment, an internal digital-to-analog converter (DAC) includes an array of capacitors with binary weighted values, and at least one compensating capacitor inserted among the binary-weighted capacitors. A comparator receives and compares a sampled input signal and an output of the DAC. Non-binary successive approximation register (SAR) control logic controls the sampling of the input signal and controls a sequence of comparisons based on a comparison result of the comparator. The SAR control logic controls each comparison when signal or charge in the DAC becomes stable to the accuracy of, for example, at least two bits. A binary-error-tolerant corrector is then used to compensate the sampling error.

BRIEF DESCRIPTION OF THE DRAWINGS

FIG. 4 shows the operation of the binary-error-tolerant correction;

FIG. 5 shows the operation of the binary-error-tolerant correction on the output of FIG. 3.

DETAILED DESCRIPTION OF THE INVENTION

Figure 1:
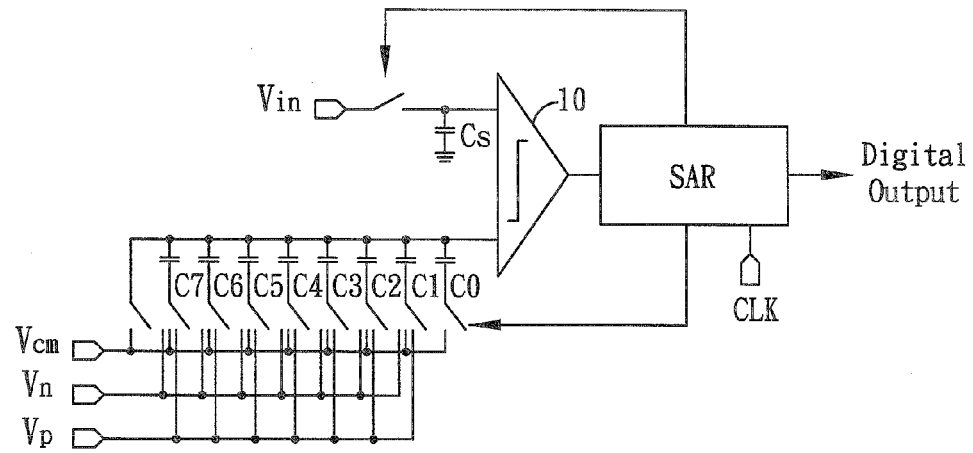
FIG. 1 illustrates an 8-bit successive approximation register (SAR) ADC.

FIG. 1 illustrates an 8-bit successive approximation register (SAR) analog-to-digital converter (ADC). One input node (such as the non-inverting node) of a comparator 10 first receives a sampled input voltage $V_{in}$, and an internal digital-to-analog converter (DAC) connected to the other input node (such as the inverting node) of the comparator 10 is reset to a common voltage $V_{cm}$. Specifically, the DAC consists of an array of capacitors (C7 to C0) with binary weighted values. Subsequently, the comparator 10 compares the input voltage $V_{in}$ and the common voltage $V_{cm}$, in order to determine whether to add or subtract V/4 in the DAC (where V is the amplitude of the input voltage). After the DAC signals become stable, a next comparison and determination is performed. The operation continues in this manner until the input voltage $V_{in}$ is approximated as:

$$V_{cm} \pm V/4 \pm V/8 \pm V/16 \pm V/32 \pm V/64 \pm V/128 \pm V/256 \text{ (V is the amplitude of the input voltage } V_{in})$$

Figure 2:
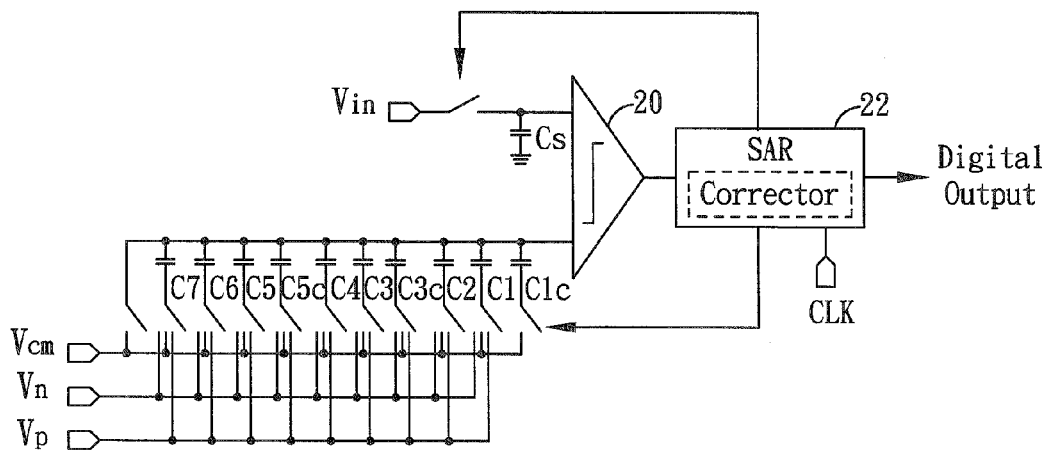
FIG. 2 illustrates a single-ended SAR ADC with binary error tolerance according to one embodiment of the present invention.

FIG. 2 illustrates a single-ended SAR ADC with binary error tolerance according to one embodiment of the present invention. Although an 8-bit ADC is exemplified in the embodiment, it is appreciated that the present invention is generally adaptable for n-bit ADC. In the embodiment, the SAR ADC includes an internal DAC that consist of an array of capacitors (C7 to C1c) with non-binary weighted value:

C7=2C6=4C5=4C5c=8C4=16C3=16C3c=32C2=64C1=64C1c

The SAR ADC also includes a comparator 20 that receives and compares sampled input voltage $V_{in}$, and the output of the DAC. A SAR control logic ("SAR") 22 controls the sampling of the input voltage $V_{in}$, and controls a sequence of comparisons based on the comparison result of the comparator 20, and finally outputs the equivalent digital output that approximates the input voltage $V_{in}$.

In operation, one input node (such as the non-inverting node) of the comparator 20 first receives a sampled input voltage $V_{in}$, and the DAC connected to the other input node (such as the inverting node) of the comparator 20 is reset to a common voltage $V_{cm}$. Specifically, the DAC is reset to the common voltage $V_{cm}$ by connecting the switches of the capacitors in the DAC to the common voltage $V_{cm}$. Subsequently, the comparator 20 compares the input voltage $V_{in}$ and the common voltage $V_{cm}$, in order to determine whether to add or subtract V/4 in the DAC (where V is the amplitude of the input voltage). In one exemplary embodiment, after the DAC signals or charges become stable to the accuracy of one bit, at a time when the signal or charge of the DAC has not been completely settled, the SAR 22 moves to the next bit down, and a next comparison and determination is performed. Due to the incomplete stability of the DAC signals, an error of V/4 (V/4*1/2$^1$+V/8) is incurred. As the voltage has remaining varying value of about V/8 (V/16±V/32±V/64±V/128±V/256), a voltage of ±V/8 needs to be added up to compensate the error. The operation sequence continues in this manner all the way down to the least significant bit (LSB). The input voltage $V_{in}$ is then approximated as:

$V_{cm}$±V/4±V/8±V/8±V/16±V/16±V/32±V/32±V/64±V/64±V/128±V/128±V/256±V/256

In an alternative exemplary embodiment (FIG. 2), after the DAC signals or charges become stable to the accuracy of two bits (instead of one bit), the SAR 22 moves to the next bit down, and the next comparison and determination is performed. Due to the incomplete stability of the DAC signals, an error of 3V/16 (V/4*1/2$^2$+V/8) is incurred. As the voltage has a remaining varying value of about V/8 (V/16±V/32±V/64±V/128±V/256), a voltage of ±V/16 needs to be added up to compensate the error. The operation sequence continues in this manner all the way down to the LSB. The input voltage $V_{in}$ is then approximated as:

$V_{cm}$±V/4±V/8±V/16±V/16±V/32±V/32±V/64±V/64±V/128±V/256±V/256

The following analysis discusses how many bits of accuracy are required to optimize the SAR DAC after the DAC signals or charges become stable to the accuracy of the required bits. For an N-bit ADC, assume that the DAC becomes stable to the accuracy of x bits, and the period between the commencement of the comparator's comparison and the commencement of the DAC's operation is $y^{\Delta}t$ (where $^{\Delta}t$=RC*ln 2), the total conversion time $T_{total}$ may be approximated as:

$$T_{total}(x, y, N) \approx T_{sample} + (x+y)\Delta t \cdot \left(N + \frac{N-2}{x}\right)$$

-continued $$\approx T_{sample} + N(x+y)\Delta t + (N-2)\cdot \Delta t + \left(\frac{N-2}{x}\right)\cdot y\Delta t$$

Taking partial derivative with respect to x:

$$\frac{\partial T_{total}(x, y, N)}{\partial x} \approx N \cdot \Delta t - \left(\frac{N-2}{x^2}\right)\cdot (y\Delta t) = 0$$

$$\Rightarrow N \cdot \Delta t - \left(\frac{N-2}{x^2}\right)\cdot y\Delta t = 0$$

$$\Rightarrow N = y \cdot \left(\frac{N-2}{x^2}\right)$$

$$\Rightarrow x \approx \sqrt{y\frac{N-2}{N}}$$

Taking an 8-bit ADC for example, assume that y≈5, we conclude that optimizing x≈2. This may be verified by comparing the following various total conversion time with various x's:

x=1→$T_{total}$=$T_{sample}$+(1+5)$\Delta t$*(8+6)=$T_{sample}$+84$\Delta t$ x=2→$T_{total}$=$T_{sample}$+(2+5)$\Delta t$*(8+3)=$T_{sample}$+77$\Delta t$ x=3→$T_{total}$=$T_{sample}$+(3+5)$\Delta t$*(8+2)=$T_{sample}$+80$\Delta t$ x=8→$T_{total}$=$T_{sample}$+(8+5)$\Delta t$*8=$T_{sample}$+104$\Delta t$ (corresponding to the ADC as shown in FIG. 1)

Accordingly, the ADC is optimized when x=2, and three compensating capacitors (that is, capacitors C5c, C3c and C1c) are used to correct the SAR ADC as shown in FIG. 2. In general, the amount of the required compensating capacitors may be expressed as [(n−2)/x] for an n-bit ADC, where [ ] is the Gaussian operator that takes the integer portion of a value. In the embodiment, the compensating capacitors are allocated among the original non-compensated capacitors (C7, C6, C5, C4, C3, C2 and C1) in the following manner: the first compensating capacitor (C5c) is allocated at a position following the third capacitors (C5) after the first two capacitors C7 and C6; the second compensating capacitor (C3c) is allocated at a position following the next two capacitors (C3); and the third compensating capacitor (C1c) is allocated at a position following the further next two capacitors (C1). The optimization method as discussed above may be applied to an ADC with different resolution. Further, it is noted that the performance of the optimization method becomes more prominent with respect to an ADC with larger resolution.

Figure 3:
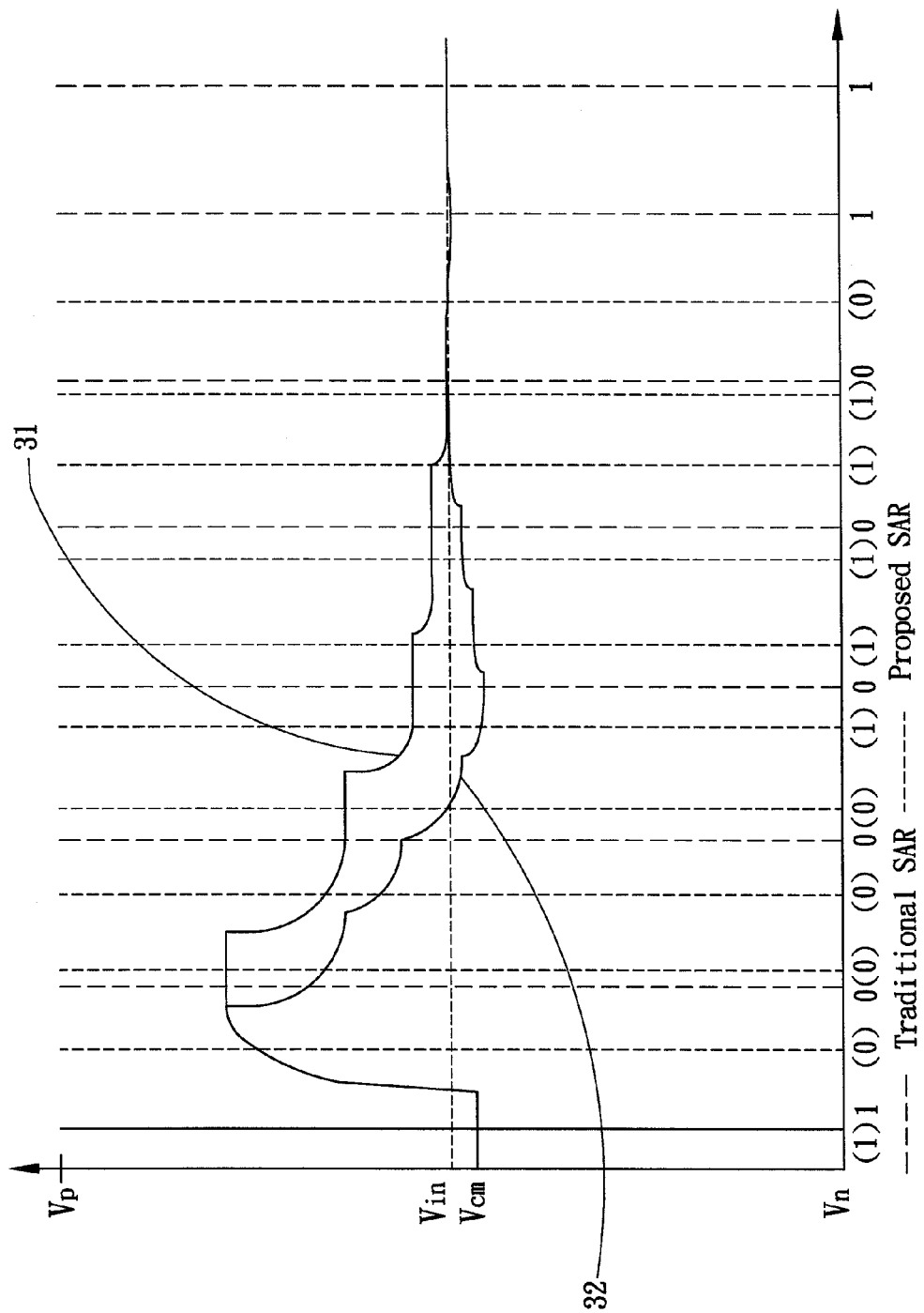
FIG. 3 illustrates a sampling waveform corresponding to FIG. 1 and the waveform corresponding to FIG. 2.

FIG. 3 illustrates an exemplary sampling waveform 31 corresponding to FIG. 1 and the waveform 32 corresponding to FIG. 2 (that is, x=2). The eleven (11) sampled binary (or digital) numerals with parenthesis (that is, 10000111110) represent the output of the comparator 20. Subsequently, this 11-bit output is processed by a binary-error-tolerant corrector in the SAR 22 into an 8-bit digital output of the ADC, therefore compensating the associated sample error. Although the binary-error-tolerant corrector of the present embodiment is located in the SAR 22, the corrector may be located outside of the SAR 22 in other embodiments.

Regarding the ADC of FIG. 1, the output may be expressed as:

$$\text{Out}=128.\,B1+64.\,B2+32.\,B3+16.\,B4+8.\,B5+4.\,B6+2.\,B7+1.\,B8$$

or $$\text{Out}=(0+255)/2\pm64\pm32\pm16\pm8\pm4\pm2\pm1\pm0.5$$

where the "+" or "−" is determined by "1" or "0" of Bn, n=1, 2, . . . , 8.

Regarding the ADC of FIG. 2, the output may be expressed as:

$$\text{Out}=(0+255)/2\pm64\pm32\pm16\pm16\pm8\pm4\pm4\pm2\pm1\pm1\pm0.5$$

or $$\text{Out}=-21+128.\,B1+64.\,B2+32.\,B3+32.\,B4+16.\,B5+8.\,B6+8.\,B7+4.\,B8+2.\,B9+2.\,B10+1.\,B11$$

which may be equivalently expressed as that in FIG. 4. Regarding FIG. 3, the exemplary output (10000111110) may be expressed as that in FIG. 5.

Figure 6:
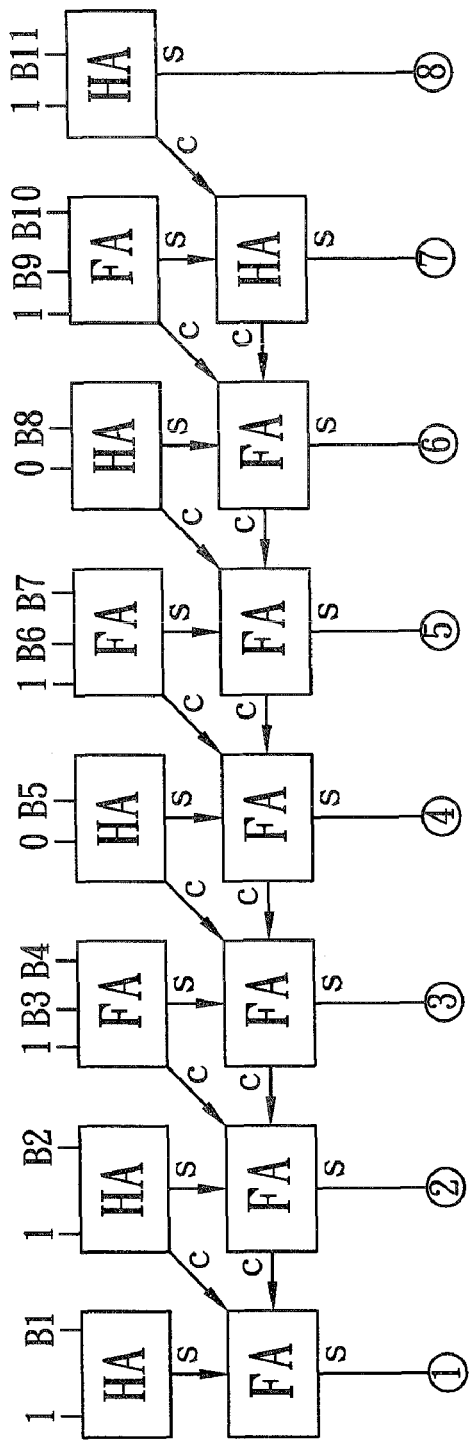
FIG. 6 illustrates a binary-error-tolerant corrector according to one embodiment of the present invention.

FIG. 6 illustrates the binary-error-tolerant corrector, according to one embodiment of the present invention, which transforms the 11-bit output (B1 B2 B3 . . . B11) of the comparator 20 into the 8-bit ADC output. Specifically, some half adders (HAs) are used to add up two inputs (for example, "1" and B11), and some full adders (FAs) are used to add up three inputs (for example, "1", B9 and B10). Each half adder or full adder outputs a carry bit C to the preceding neighboring half/full adder and a summation bit S to the parallel half/full adder.

According to the embodiment as discussed above, the proposed non-binary SAR ADC operates faster than conventional SAR ADC because of sampling incompletely settling signal, while using simple binary-error-tolerance corrector to obtain ADC output.

Although specific embodiments have been illustrated and described, it will be appreciated by those skilled in the art that various modifications may be made without departing from the scope of the present invention, which is intended to be limited solely by the appended claims.

What is claimed is:

1. A successive approximation analog-to-digital converter (ADC), comprising:
   a digital-to-analog converter (DAC);
   a comparator that receives a sampled input signal at one input node, and receives an output of the DAC at another input node;
   non-binary successive approximation register (SAR) control logic that controls sampling of the input signal and controls a sequence of comparisons based on a comparison result of the comparator, wherein the SAR control logic controls each comparison when signal or charge in the DAC has not been completely settled; and
   a corrector that compensates error incurred in the output of the comparator.

2. The ADC of claim 1, wherein the SAR control logic controls each comparison when signal or charge in the DAC becomes stable to an accuracy of at least one bit.

3. The ADC of claim 2, wherein the SAR control logic controls each comparison when signal or charge in the DAC becomes stable to an accuracy of x bits.

4. The ADC of claim 3, wherein the DAC comprises an array of capacitors with binary weighted values, and at least one compensating capacitor inserted among the capacitors with binary weighted values.

5. The ADC of claim 4, wherein the DAC requires compensating capacitors with amount of [(n−2)/x] for an n-bit ADC, where [ ] is the Gaussian operator that takes integer portion of a value.

6. The ADC of claim 5, wherein the corrector comprises a plurality of adders that respectively add up corresponding output bits of the comparator.

7. The ADC of claim 1, wherein the ADC has n bits of resolution.

8. The ADC of claim 7, wherein the SAR control logic controls each comparison when signal or charge in the DAC becomes stable to an accuracy of x bits, and the DAC requires compensating capacitors with amount of [(n−2)/x] for the n-bit ADC, where [ ] is the Gaussian operator that takes an integer portion of a value.

9. The DAC of claim 8, wherein the ADC has eight (8) bits of resolution, and the DAC includes an array of capacitors with non-binary weighted value as follows:

$$C7=2C6=4C5=4C5c=8C4=16C3=16C3c=32C2=64C1=64C1c.$$

10. The ADC of claim 9, wherein the output of SAR control logic is corrected by the corrector according to a correction operation as follows:

$$\text{Output}=-21+128.\,B1+64.\,B2+32.\,B3+32.\,B4+16.\,B5+8.\,B6+8.\,B7+4.\,B8+2.\,B9+2.\,B10+1.\,B11.$$

11. The ADC of claim 10, wherein the corrector comprises a plurality of adders for respectively adding up corresponding bits with a same weighting value in said correction operation.

12. The ADC of claim 11, wherein the correction operation is performed to transform (B1 B2 B3 . . . B11) to (A1 A2 A3 . . . A8) as follows:

| | 1 | 1 | 1 | 0 | 1 | 0 | 1 | 1 |
|---|---|---|---|---|---|---|---|---|
| | B1 | B2 | B3 | B5 | B6 | B8 | B9 | B11 |
| + | | B4 | | B7 | | B10 | | |
| | A1 | A2 | A3 | A4 | A5 | A6 | A7 | A8 |

* * * * *